(12) United States Patent
Chen et al.

(10) Patent No.: US 10,631,638 B2
(45) Date of Patent: Apr. 28, 2020

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); I-Ming Tseng, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 227 days.

(21) Appl. No.: 15/614,780

(22) Filed: Jun. 6, 2017

(65) Prior Publication Data
US 2018/0103757 A1 Apr. 19, 2018

(30) Foreign Application Priority Data
Oct. 13, 2016 (TW) .............................. 105133363 A

(51) Int. Cl.
| | | |
|---|---|---|
| A47B 88/43 | (2017.01) | |
| H04N 5/225 | (2006.01) | |
| H05K 7/18 | (2006.01) | |
| A47B 47/00 | (2006.01) | |

(52) U.S. Cl.
CPC .......... *A47B 88/43* (2017.01); *A47B 47/0075* (2013.01); *H04N 5/225* (2013.01); *H05K 7/183* (2013.01)

(58) Field of Classification Search
CPC .... A47B 88/43; A47B 47/0075; H04N 5/225; H05K 7/183
See application file for complete search history.

(56) References Cited

U.S. PATENT DOCUMENTS

| | | | | |
|---|---|---|---|---|
| 5,571,256 A | * | 11/1996 | Good ........................ | H02B 1/36 211/151 |
| 6,702,412 B2 | * | 3/2004 | Dobler ................. | A47B 88/407 312/205 |
| 6,926,377 B2 | * | 8/2005 | Lammens .............. | A47B 88/49 312/333 |
| 6,979,067 B2 | * | 12/2005 | Yang .................... | A47B 88/477 312/334.46 |
| 7,090,319 B2 | * | 8/2006 | Milligan .............. | A47B 88/493 312/334.44 |
| 7,111,913 B2 | * | 9/2006 | Dubon ................... | A47B 88/49 312/333 |
| 8,596,471 B2 | * | 12/2013 | Chen .................... | H05K 7/1421 211/153 |
| 8,721,012 B2 | | 5/2014 | Chen et al. | |
| 8,967,744 B2 | | 3/2015 | Chen et al. | |
| 9,648,952 B2 | * | 5/2017 | Nuckolls .............. | A47B 88/433 |

(Continued)

*Primary Examiner* — Ko H Chan
(74) *Attorney, Agent, or Firm* — Rosenberg, Klein & Lee

(57) ABSTRACT

A slide rail assembly includes a first rail, a second rail, and a reinforcing structure. The first rail includes a front end portion and a rear end portion. The second rail is displaceable with respect to the first rail. The reinforcing structure is located at the second rail. A portion of the reinforcing structure protrudes beyond the front end portion of the first rail when the second rail is displaced from a first position to a second position with respect to the first rail.

9 Claims, 9 Drawing Sheets

(56) References Cited

U.S. PATENT DOCUMENTS

| | | | |
|---|---|---|---|
| 2002/0050773 A1* | 5/2002 | Reis | A47B 88/467 |
| | | | 312/334.46 |
| 2004/0182798 A1* | 9/2004 | Williams | H05K 7/1491 |
| | | | 211/26 |
| 2008/0211366 A1* | 9/2008 | Brock | A47B 88/467 |
| | | | 312/333 |
| 2008/0217497 A1* | 9/2008 | Yang | H05K 7/1489 |
| | | | 248/298.1 |
| 2008/0303398 A1* | 12/2008 | Hsiung | A47B 88/57 |
| | | | 312/334.46 |

* cited by examiner

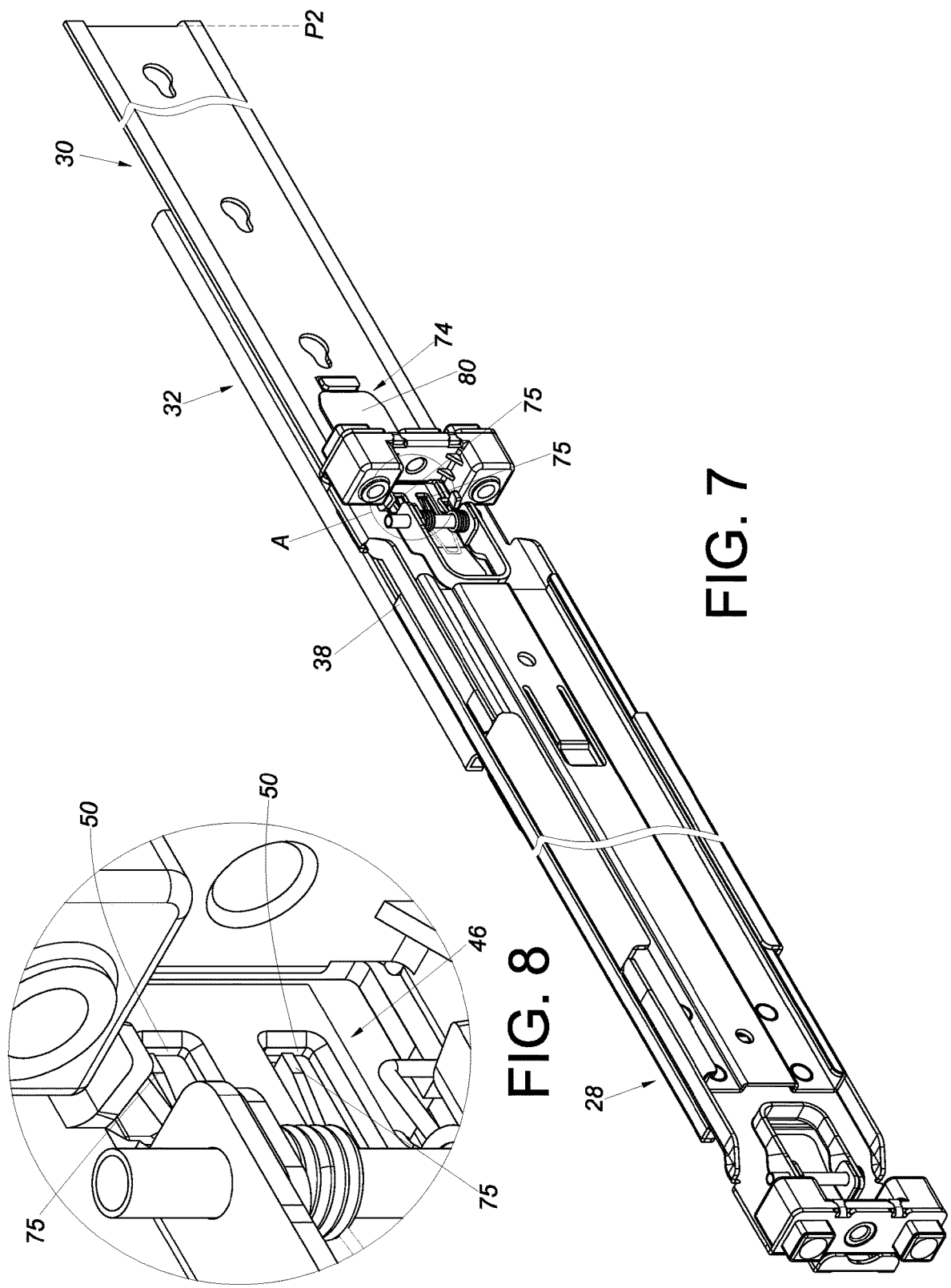

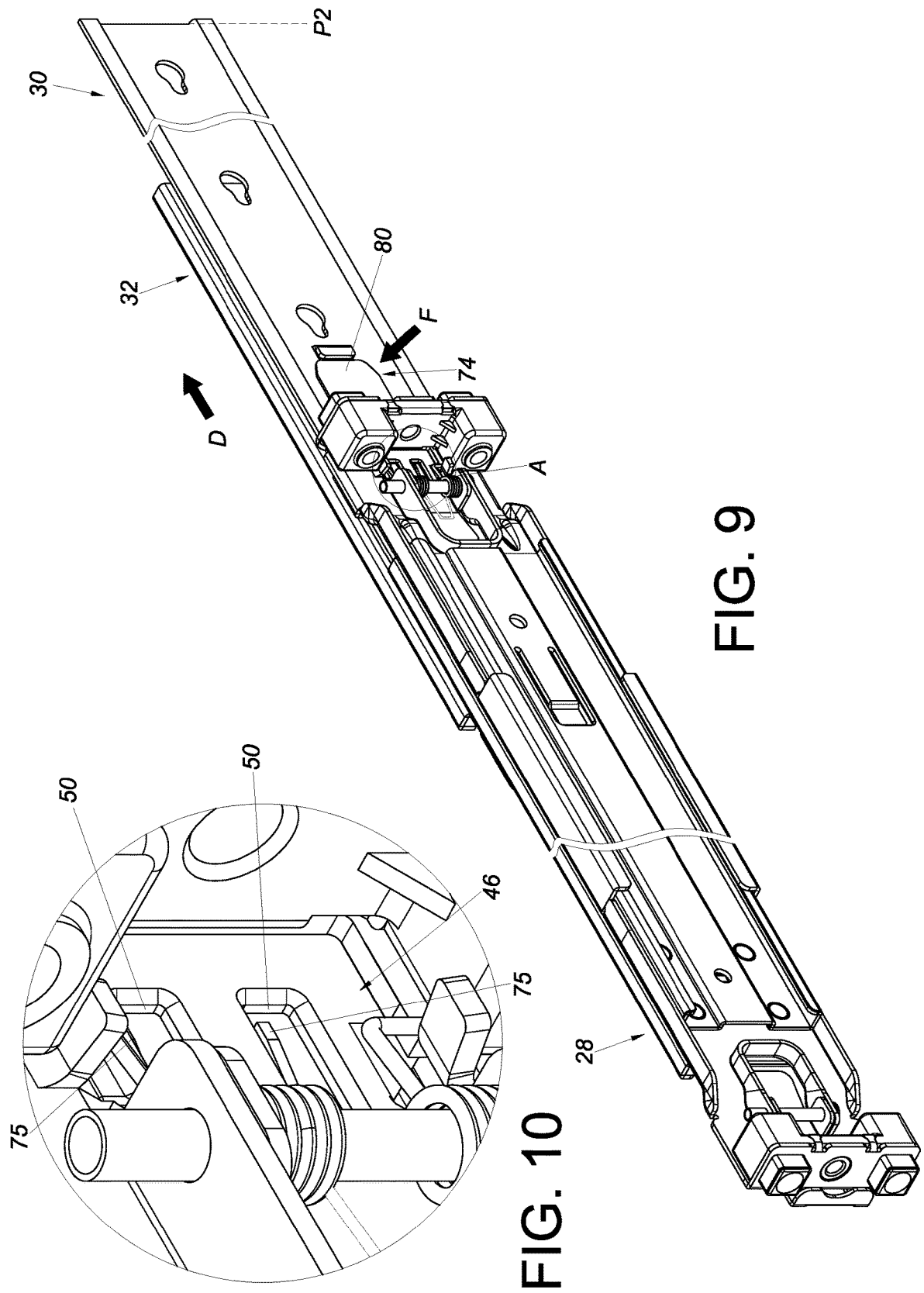

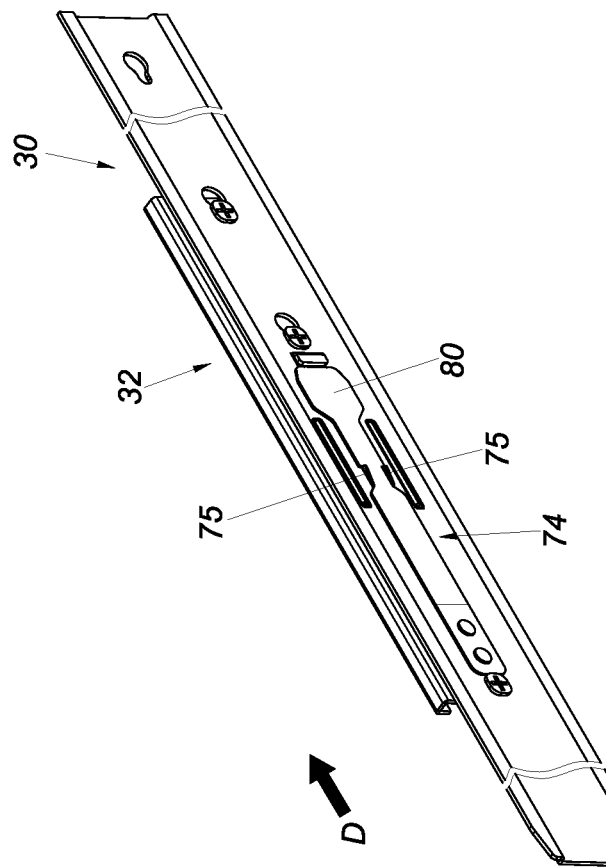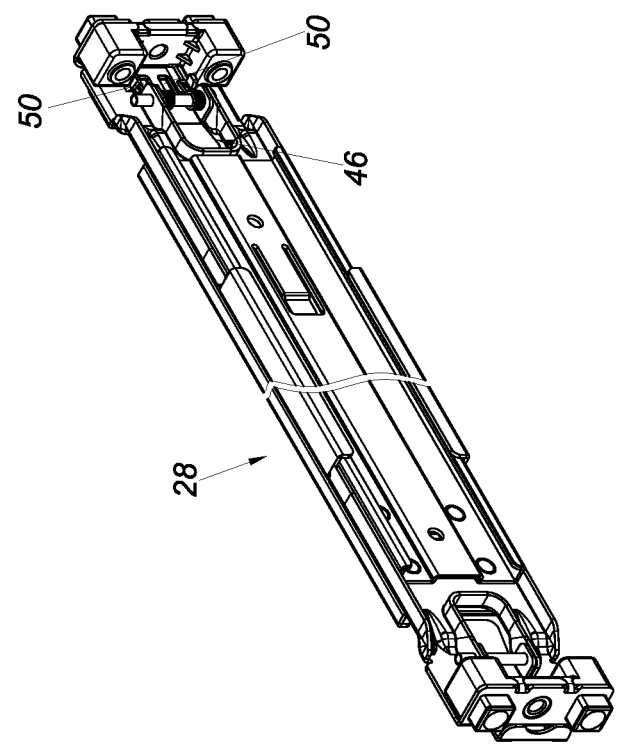
FIG. 11

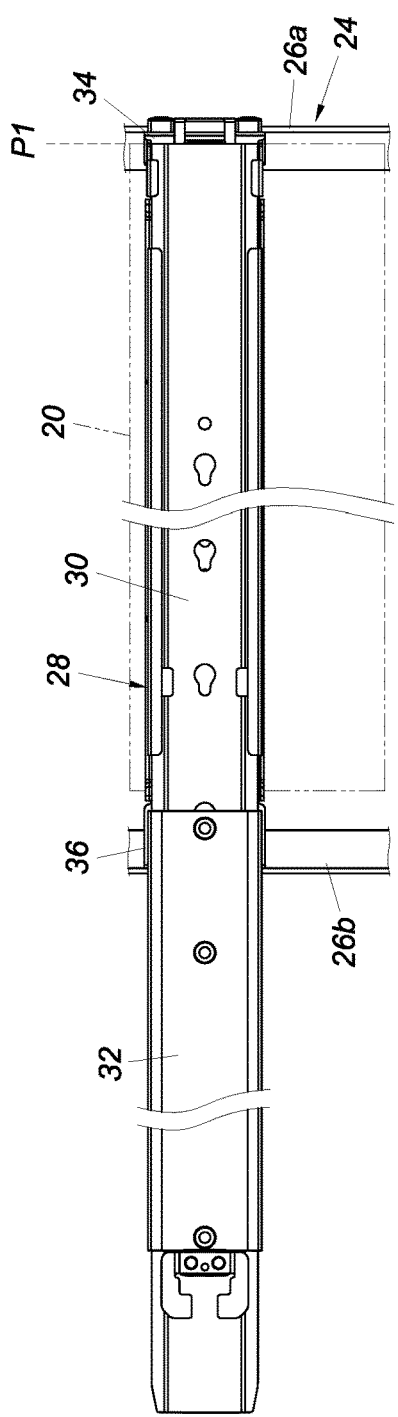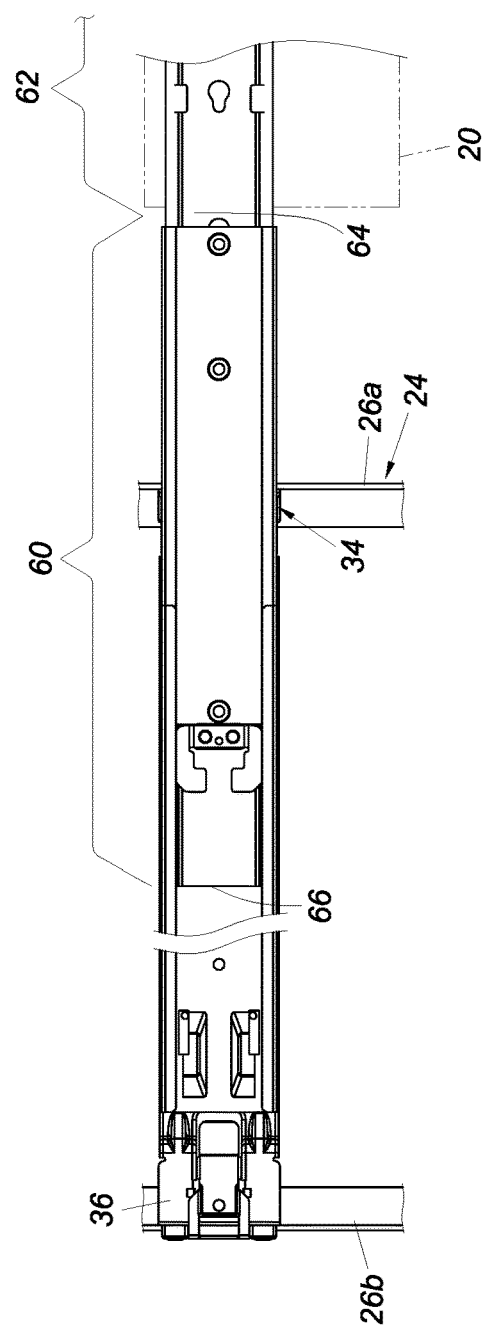

SLIDE RAIL ASSEMBLY

FIELD OF THE INVENTION

The present invention relates to a slide rail assembly and more particularly to one with reinforced slide rails.

BACKGROUND OF THE INVENTION

Generally, an object to be supported in a rack-based system is mounted to a rack via a slide rail assembly whose first rail is mounted to a post of the rack and whose second rail is displaceable with respect to the first rail and configured for supporting the object.

U.S. Pat. No. 6,702,124 B2, for example, discloses a slide assembly (14) which, as shown in FIG. 1 accompanying the specification of the US patent, includes a stationary member (26), an intermediate slide member (28), and an inner slide member (30). The stationary member (26) is configured to be mounted to two columns (20, 18) of a rack (12) via two brackets (34, 38) respectively. The intermediate slide member (28) lies between the stationary member (26) and the inner slide member (30). The inner slide member (30) has a front section for supporting a server unit (10). According to the FIG. 1 mentioned above, the server unit (10) is outside the rack (12) when the inner slide member (30) is at an extended position with respect to the intermediate slide member (28), and a rear section of the inner slide member (30) is supported by the intermediate slide member (28) while at the extended position. As the server unit (10) may vary in weight, the front section of the inner slide member (30) is subject to deformation with respect to the rear section or even damage if the weight of the server unit (10) slightly exceeds the loading capacity of the inner slide member (30) and acts on the inner slide member (30) for a long time.

SUMMARY OF THE INVENTION

The present invention provides a slide rail assembly in which the structural strength of slide rails is enhanced.

According to one aspect of the present invention, a slide rail assembly includes a first rail, a second rail, and a reinforcing structure. The second rail can be displaced with respect to the first rail. The reinforcing structure is located at the second rail. When the second rail is displaced with respect to the first rail from a first position to a second position, the reinforcing structure partially protrudes beyond the first rail.

Preferably, the first rail includes a front end portion and a rear end portion, and when the second rail is displaced with respect to the first rail from a first position to a second position, the reinforcing structure partially protrudes beyond the front end portion of the first rail.

Preferably, the second rail includes a first rail section and a second rail section. The first rail section includes a front portion and a rear portion. The second rail section extends from the front portion of the first rail section. When the second rail is displaced with respect to the first rail from a retracted position to an extended position, both the front portion of the first rail section of the second rail and the second rail section of the second rail protrude beyond the first rail, but the rear portion of the first rail section of the second rail does not. In addition, the reinforcing structure is provided between the front and rear portions of the first rail section of the second rail.

Preferably, the reinforcing structure is a supporting member made of metal and is detachably mounted between the front and rear portions of the first rail section of the second rail.

Preferably, the reinforcing structure is a plurality of supporting ribs provided on the second rail.

Preferably, the second rail includes an upper wall, a lower wall, and a longitudinal wall connected between the upper wall and the lower wall; and the reinforcing structure includes a sidewall mounted on the longitudinal wall of the second rail.

Preferably, the slide rail assembly further includes a bracket device mounted on the first rail and an engaging member arranged on the second rail. The bracket device includes a fastening member and an elastic member for applying an elastic force to the fastening member. The fastening member includes a first engaging structure. The engaging member, on the other hand, includes a second engaging structure. The second engaging structure is engaged with the first engaging structure when the second rail has been displaced with respect to the first rail to the extended position.

Preferably, the slide rail assembly is configured to be mounted to a first post and a second post of a rack via a first bracket device and a second bracket device respectively. Moreover, when the second rail is displaced with respect to the first rail from the first position to the second position, the reinforcing structure partially protrudes beyond the first post and is therefore outside the rack.

BRIEF DESCRIPTION OF THE DRAWINGS

FIG. 4 is an enlarged view of the area A in FIG. 2;

FIG. 5 is an enlarged view of the area B in FIG. 2;

FIG. 7 is a perspective view in which the second rail of the slide rail assembly according to an embodiment of the present invention is displaced in a certain direction with respect to the first rail to a predetermined position, with the engaging member engaged with the fastening member;

FIG. 8 is an enlarged view of the area A in FIG. 7;

FIG. 9 is similar to FIG. 7, except that the engaging member is disengaged from the fastening member;

FIG. 10 is an enlarged view of the area A in FIG. 9;

FIG. 11 shows how the second rail of the slide rail assembly according to an embodiment of the present invention is detached from the first rail;

FIG. 12 schematically shows the second rail of the slide rail assembly according to an embodiment of the present invention in a retracted state with respect to the first rail;

FIG. 13 schematically shows the second rail of the slide rail assembly according to an embodiment of the present invention in an extended state with respect to the first rail;

DETAILED DESCRIPTION OF THE INVENTION

Figure 1:
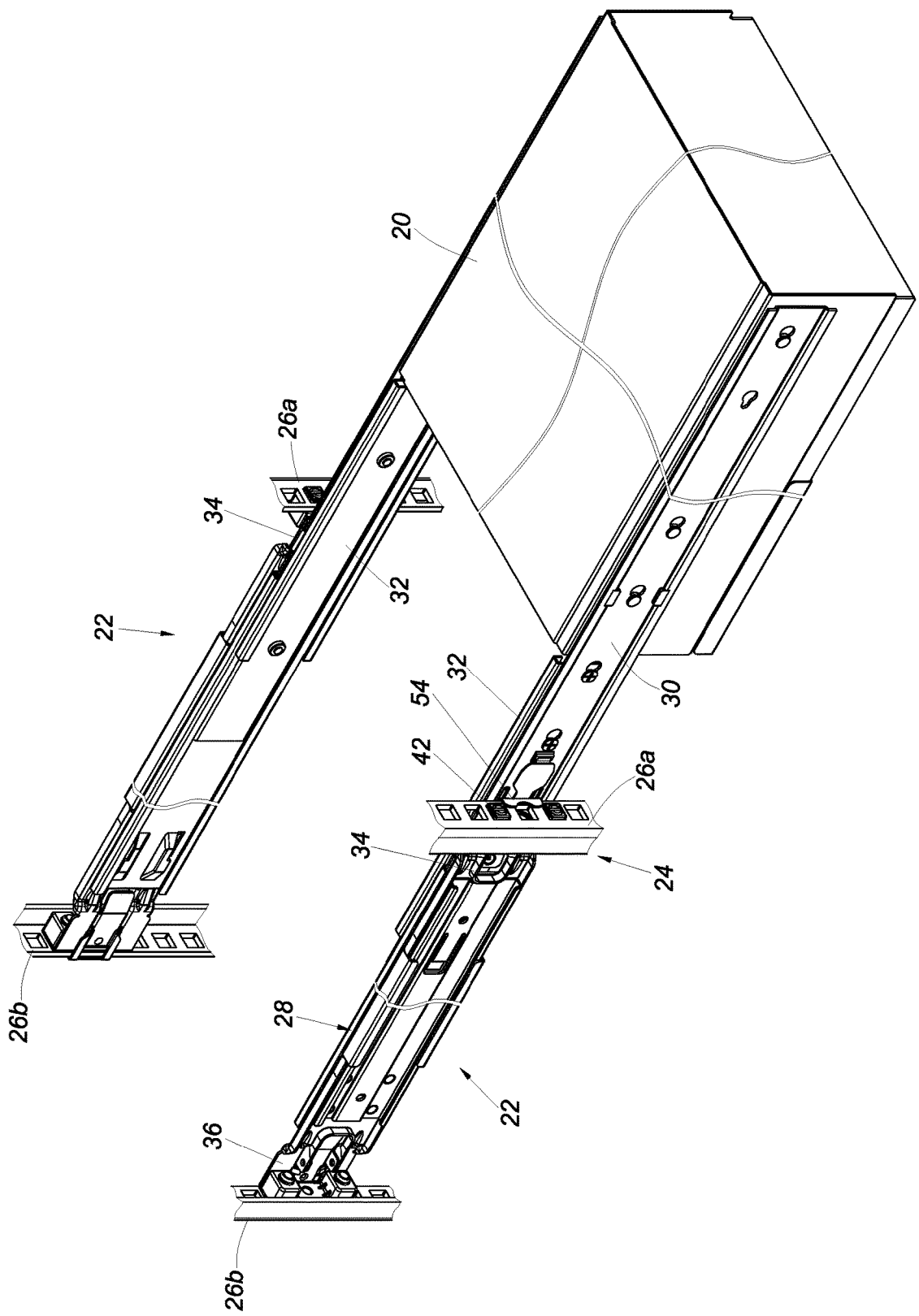
FIG. 1 is a perspective view showing how an object is mounted to a rack via a pair of slide rail assemblies according to an embodiment of the present invention.

FIG. 1 shows how an object 20 is mounted to a rack 24 via a pair of slide rail assemblies 22, wherein the object 20 is a piece of electronic equipment for example. The rack 24 includes a pair of first posts 26a and a pair of second posts 26b that are spaced from the first posts 26a. Each slide rail assembly 22 includes a first rail 28, a second rail 30, and a reinforcing structure 32.

Each first rail 28 is mounted to the corresponding first post 26a and second post 26b of the rack 24 through a first bracket device 34 (also referred to herein as the bracket device) and a second bracket device 36 respectively, thereby mounting the slide rail assemblies 22 to the rack 24. The second rails 30 are mounted with the object 20 so that the object 20 can be pulled out of the rack 24 and pushed back into the rack 24 by displacing the second rails 30 with respect to the first rails 28.

Figure 2:
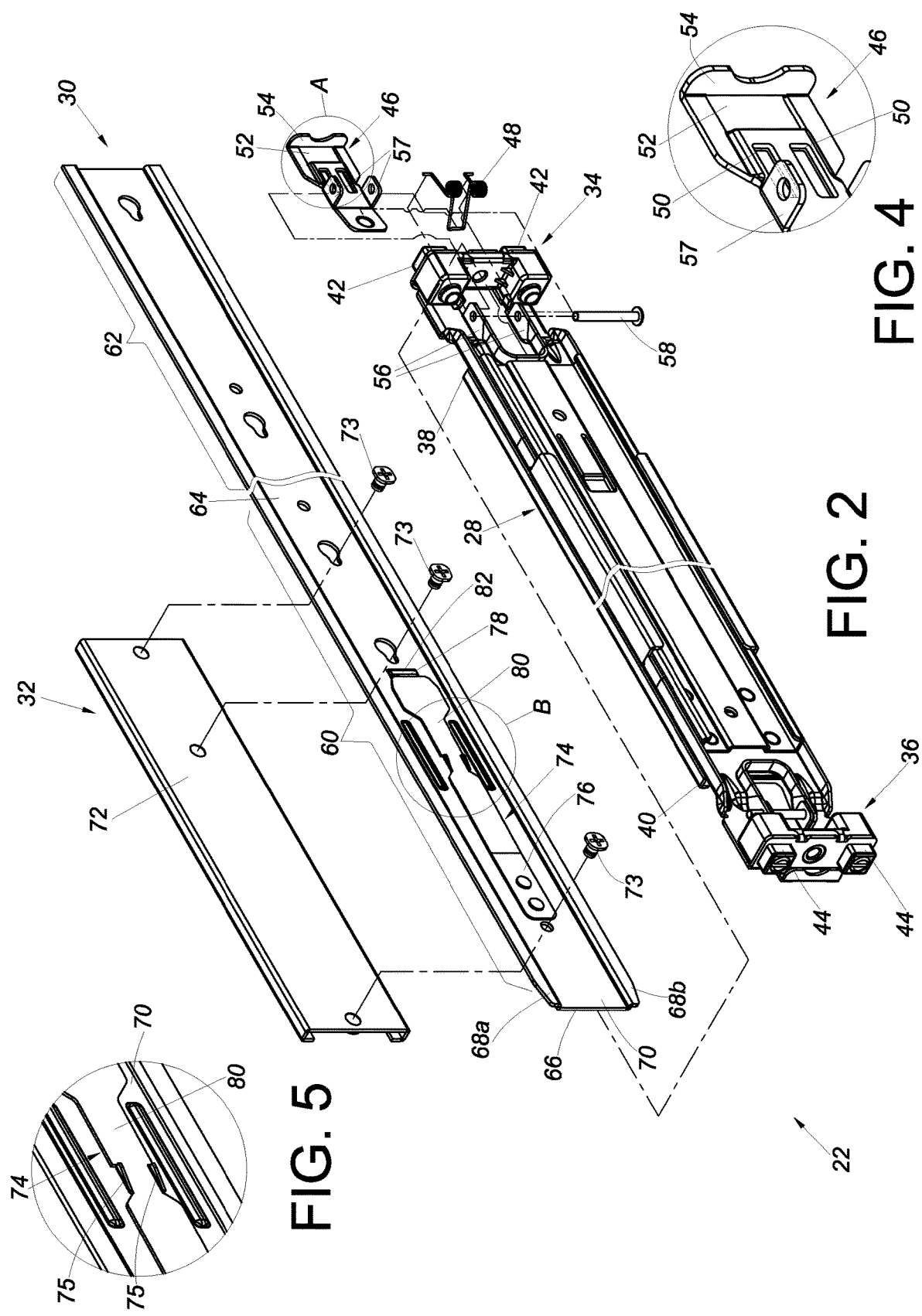
FIG. 2 is an exploded perspective view of the slide rail assembly according to an embodiment of the present invention.
Figure 3:
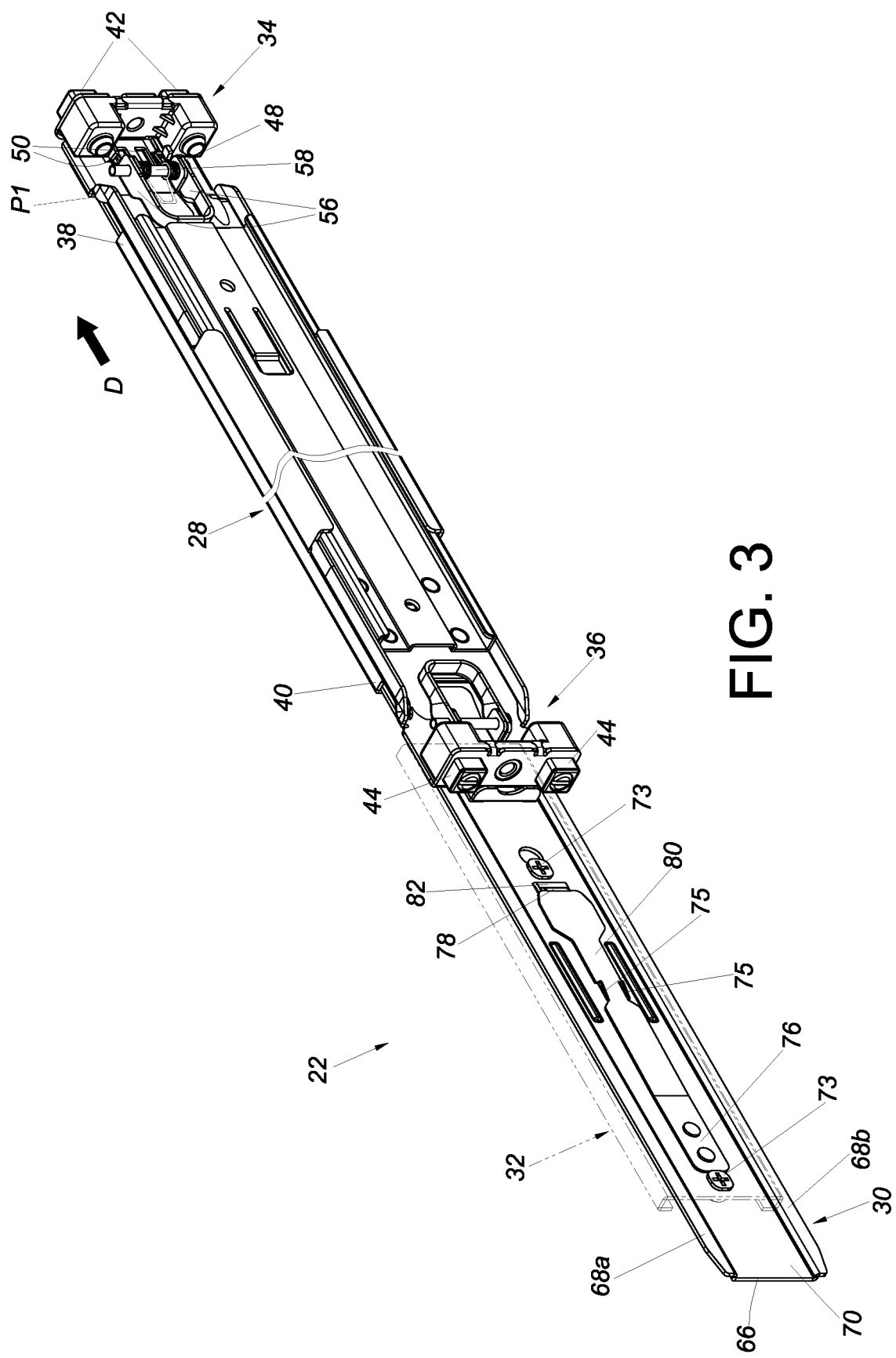
FIG. 3 is an assembled perspective view of the slide rail assembly according to an embodiment of the present invention.

As shown in FIG. 2 and FIG. 3, the first rail 28 includes a front end portion 38 and a rear end portion 40. The first bracket device 34 is mounted on the first rail 28 at a position adjacent to the front end portion 38 by way of example, and the second bracket device 36 is mounted on the first rail 28 at a position adjacent to the rear end portion 40 by way of example. The first bracket device 34 includes at least one first mounting member 42 and the second bracket device 36 includes at least one second mounting member 44, so that the first bracket device 34 and the second bracket device 36 can be mounted respectively to the corresponding first post 26a and the corresponding second post 26b of the rack 24. As the method of mounting the bracket devices to the corresponding posts is well known in the art, further description is omitted herein for the sake of brevity.

Preferably, the first bracket device 34 includes a fastening member 46 and an elastic member 48. The fastening member 46 includes at least one first engaging structure 50 (as can be seen more clearly in FIG. 4). More specifically, the fastening member 46 includes a lateral portion 52 and a fastening portion 54 substantially perpendicularly connected to the lateral portion 52. Preferably, the at least one first engaging structure 50 is located at the lateral portion 52. Moreover, the first bracket device 34 further includes at least one lug 56, the fastening member 46 includes at least one connecting portion 57 bent with respect to the lateral portion 52, and the at least one connecting portion 57 is movably connected to the at least one lug 56. In this embodiment, the at least one connecting portion 57 of the fastening member 46 is pivotally connected to the at least one lug 56 via a shaft 58, and the elastic member 48 is configured to apply an elastic force to the fastening member 46 in order for the fastening portion 54 of the fastening member 46 to stay in a locking state with respect to the at least one first mounting member 42 (with the fastening portion 54 of the fastening member 46 locked to the corresponding first post 26a, as shown in FIG. 1).

The second rail 30 includes a first rail section 60 and a second rail section 62. The first rail section 60 includes a front portion 64 and a rear portion 66. The second rail section 62 extends from the front portion 64 of the first rail section 60. More specifically, the second rail 30 includes an upper wall 68a, a lower wall 68b, and a longitudinal wall 70 connected between the upper wall 68a and the lower wall 68b.

The reinforcing structure 32 is located at the second rail 30. For example, the reinforcing structure 32 is provided between the front portion 64 of the first rail section 60 of the second rail 30 and the rear portion 66 of the first rail section 60 of the second rail 30. In this embodiment, the reinforcing structure 32 is a supporting member made of metal. Preferably, the reinforcing structure 32 includes a sidewall 72 that is substantially longitudinally arranged, and the sidewall 72 of the reinforcing structure 32 is detachably mounted on the longitudinal wall 70 of the second rail 30. Here, the sidewall 72 of the reinforcing structure 32 and the longitudinal wall 70 of the second rail 30 are detachably mounted to each other by threaded connection (e.g., with at least one threaded fastener 73), mechanical engagement, or the like; the present invention imposes no limitation in this regard.

Preferably, the slide rail assembly 22 further includes an engaging member 74 arranged on the second rail 30 (as can be seen more clearly in FIG. 5), and the engaging member 74 includes at least one second engaging structure 75. The at least one second engaging structure 75 and the at least one first engaging structure 50 are corresponding structures. For example, the at least one second engaging structure 75 is an engaging hook while the at least one first engaging structure 50 is a blocking wall, or the at least one second engaging structure 75 is a blocking wall while the at least one first engaging structure 50 is an engaging hook.

More specifically, the engaging member 74 is arranged on the side of the longitudinal wall 70 of the second rail 30 that is adjacent to the first rail 28. The engaging member 74 includes a first end portion 76, a second end portion 78, and an elastic arm 80 located between the first end portion 76 and the second end portion 78. The first end portion 76 may be connected to the longitudinal wall 70 of the second rail 30 by riveting, threaded connection, soldering, or the like. The elastic arm 80 is tilted upward with respect to the first end portion 76 (or the longitudinal wall 70) in order to provide an elastic force. The elastic arm 80 can be pressed against a supporting section 82 of the second rail 30 via the second end portion 78. For example, the supporting section 82 is an arch-shaped structure against whose inner side the second end portion 78 can be pressed. The second engaging structure 75 is arranged on the elastic arm 80.

Figure 6:
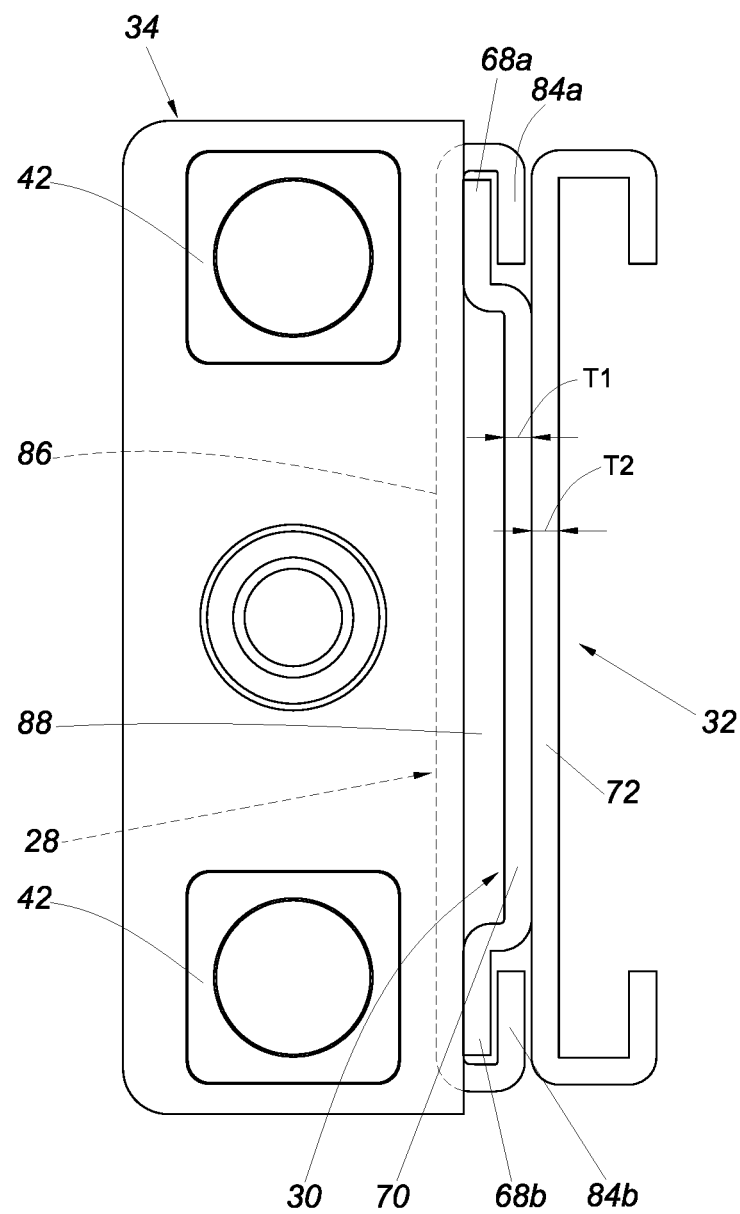
FIG. 6 is a sectional view of the slide rail assembly in FIG. 3.

Referring to FIG. 6 in conjunction with FIG. 2, the first bracket device 34 is mounted on the first rail 28 at a position adjacent to the front end portion 38, and the first rail 28 includes an upper wall 84a, a lower wall 84b, and a longitudinal wall 86 connected between the upper wall 84a and the lower wall 84b. The upper wall 84a, the lower wall 84b, and the longitudinal wall 86 of the first rail 28 define a channel 88. The second rail 30 can be displaced with respect to the channel 88. The upper wall 68a and the lower wall 68b of the second rail 30 correspond to the upper wall 84a and the lower wall 84b of the first rail 28 respectively.

The reinforcing structure 32 is provided on the side of the longitudinal wall 70 of the second rail 30 that faces away from the first rail 28 (for example, the reinforcing structure 32 and the engaging member 74 are located on two opposite sides of the longitudinal wall 70 of the second rail 30 respectively). The longitudinal wall 70 of the second rail 30 has a first thickness T1, and the sidewall 72 of the reinforcing structure 32 has a second thickness T2. Once the sidewall 72 of the reinforcing structure 32 is mounted on the longitudinal wall 70 of the second rail 30, the structural strength of the second rail 30 is enhanced by the reinforcing structure 32.

Referring to FIG. 7, when the second rail 30 is displaced in a direction D with respect to the first rail 28 from a first position P1 (e.g., a retracted position, as shown in FIG. 3) to a second position P2 (e.g., an extended position), a portion of the reinforcing structure 32 protrudes beyond the front end portion 38 of the first rail 28. The second engaging structure 75 of the engaging member 74 is engaged with the first engaging structure 50 of the fastening member 46 while the second rail 30 is at the second position P2 with respect to the first rail 28 (as can be seen more clearly in FIG. 8). More specifically, the second engaging structure 75, when at the second position P2, is engaged with the first engaging structure 50 due to the elastic force of the elastic arm 80, thereby keeping the second rail 30 at the second position P2.

To further displace the second rail 30 in the direction D from the second position P2 with respect to the first rail 28, referring to FIG. 9, FIG. 10, and FIG. 11, the operator may operate the elastic arm 80 of the engaging member 74 by applying a force F thereto so that the second engaging structure 75 is disengaged from the first engaging structure 50 of the fastening member 46. In other words, the second rail 30 can be further displaced in the direction D from the second position P2 with respect to the first rail 28. For example, the second rail 30 can be further displaced in the direction D with respect to the first rail 28 and thus detached from the first rail 28. Or, the second rail 30 can be displaced with respect to the first rail 28 to the aforesaid first position P1, as shown in FIG. 3.

Referring to FIG. 12, the first rail 28 is mounted on the first post 26a and the second post 26b of the rack 24 via the first bracket device 34 and the second bracket device 36 respectively, and the second rail 30 is mounted with the object 20.

Referring to FIG. 13 in conjunction with FIG. 12, when the second rail 30 is displaced with respect to the first rail 28 from the first position P1 to the second position P2, a portion of the reinforcing structure 32 protrudes beyond the front end portion 38 of the first rail 28, or a portion of the reinforcing structure 32 protrudes beyond the first post 26a and is therefore outside the rack 24. While at the second position P2, both the front portion 64 of the first rail section 60 of the second rail 30 and the second rail section 62 of the second rail 30 protrude beyond the front end portion 38 of the first rail 28, but the rear portion 66 of the first rail section 60 of the second rail 30 does not protrude beyond the front end portion 38 of the first rail 28. It can be inferred from the above that the reinforcing structure 32 can protect the second rail 30 from deformation or damage when the second rail 30 is at the second position P2 with respect to the first rail 28 and carries an overweight object 20.

Figures 14, 15:
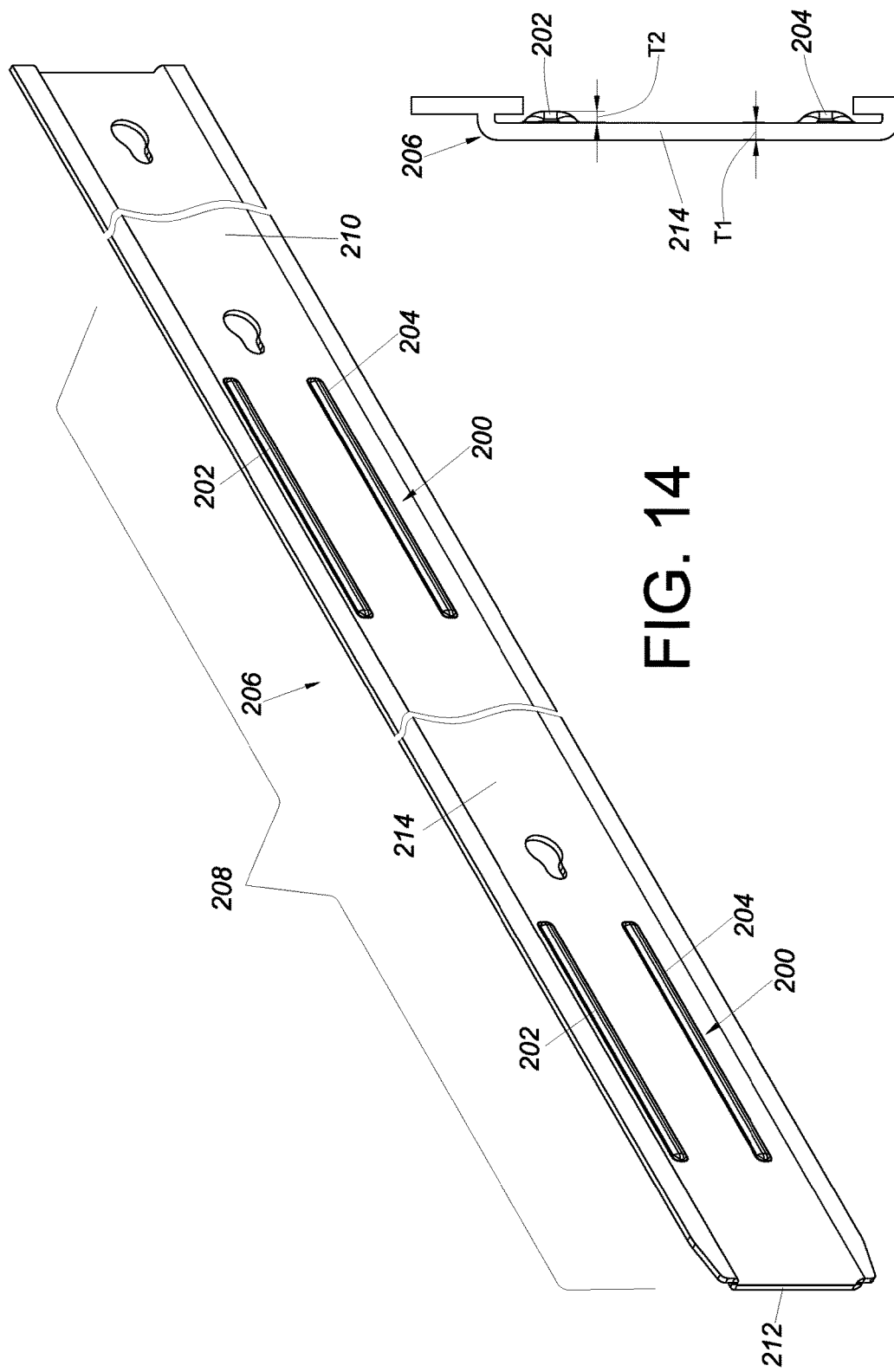
FIG. 14 is a perspective view of the second rail of a slide rail assembly according to another embodiment of the present invention.
FIG. 15 is a sectional view of the second rail in FIG. 14.

FIG. 14 and FIG. 15 show the reinforcing structure 200 in another embodiment of the present invention. More specifically, the reinforcing structure 200 is a plurality of supporting ribs (e.g., a plurality of first supporting ribs 202 and a plurality of second supporting ribs 204) provided on the second rail 206. For example, the supporting ribs 202 and 204 are arranged along the length of the second rail 206 and are integrally formed with the second rail 206. Preferably, the supporting ribs 202 and 204 are provided between the front portion 210 of the first rail section 208 of the second rail 206 and the rear portion 212 of the first rail section 208 of the second rail 206. Furthermore, the longitudinal wall 214 of the second rail 206 has a first thickness T1, and the first supporting ribs 202 (or the second supporting ribs 204) of the reinforcing structure 200 have a second thickness T2. The reinforcing structure 200 thus increases the structural strength of the second rail 206.

While the present invention has been disclosed by way of the foregoing preferred embodiments, it is understood that the embodiments described herein are not intended to be restrictive of the scope of the invention. The scope of patent protection sought by the applicant is defined by the appended claims.

What is claimed is:

1. A slide rail assembly, comprising:
a first rail;
a second rail displaceable with respect to the first rail, wherein the second rail includes a first rail section and a second rail section, the first rail section includes a front portion, a rear portion, and a longitudinal wall extending therebetween, and the second rail section extends from the front portion of the first rail section, the second rail further includes an upper wall and a lower wall, and the longitudinal wall being connected between the upper wall and the lower wall;
wherein when the second rail is displaced with respect to the first rail from a retracted position to an extended position, the front portion of the first rail section of the second rail and the second rail section of the second rail protrude beyond the first rail along an extension direction, the rear portion of the first rail section of the second rail failing to protrude beyond the first rail along the extension direction;
wherein a reinforcing structure is provided to remain between the front and rear portions of the first rail section of the second rail in the extension direction, the reinforcing structure being a supporting member made of metal and being detachably mounted between the front portion of the first rail section of the second rail and the rear portion of the first rail section of the second rail, at least a portion of the reinforcing structure being flush mounted along the longitudinal wall of the first rail section of the second rail to extend the longitudinal wall in thickness, and the reinforcing structure includes a sidewall mounted on the longitudinal wall of the second rail; and
a bracket device mounted on the first rail and an engaging member arranged on the second rail, wherein the bracket device includes a fastening member and an elastic member for applying an elastic force to the fastening member, the fastening member includes a first engaging structure, the engaging member includes a second engaging structure, and the second engaging structure is engaged with the first engaging structure when the second rail is displaced with respect to the first rail to the extended position, the first and second engaging structures being respectively disposed on wall surfaces of the first and second rails directly opposing one another.

2. The slide rail assembly of claim 1, wherein the reinforcing structure is a plurality of supporting ribs provided on the second rail.

3. The slide rail assembly of claim 1, wherein the engaging member includes an elastic arm, and the second engaging structure is engaged with the first engaging structure responsive to an elastic force provided by the elastic arm.

4. A slide rail assembly, comprising:
a first rail including a front end portion and a rear end portion;
a second rail displaceable with respect to the first rail, the second rail including a longitudinal wall, an upper wall, and a lower wall, wherein the longitudinal wall is connected between the upper wall and the lower wall;
a reinforcing structure located at the second rail to remain within a section of the second rail along an extension direction, at least a portion of the reinforcing structure being flush mounted along the longitudinal wall of the second rail to extend the longitudinal wall in thickness, the reinforcing structure being a supporting member made of metal and being mounted on the second rail and including a sidewall mounted on the longitudinal wall of the second rail;

wherein when the second rail is displaced with respect to the first rail from a first position to a second position, a portion of the reinforcing structure protrudes beyond the front end portion of the first rail along the extension direction; and a bracket device mounted on the first rail and an engaging member arranged on the second rail, wherein the bracket device includes a fastening member and an elastic member for applying an elastic force to the fastening member, the fastening member includes a first engaging structure, the engaging member includes a second engaging structure, and the second engaging structure is engaged with the first engaging structure when the second rail is displaced with respect to the first rail to the second position, the first and second engaging structures being respectively disposed on wall surfaces of the first and second rails directly opposing one another.

5. The slide rail assembly of claim 4, wherein the reinforcing structure is a plurality of supporting ribs provided on the second rail.

6. The slide rail assembly of claim 4, wherein the engaging member includes an elastic arm, and the second engaging structure is engaged with the first engaging structure responsive to an elastic force provided by the elastic arm.

7. A slide rail assembly adapted to be mounted to a first post and a second post of a rack via a first bracket device and a second bracket device respectively, the slide rail assembly comprising:

a first rail including a front end portion and a rear end portion;

a second rail displaceable with respect to the first rail, the second rail including a longitudinal wall;

a reinforcing structure located at the second rail to remain within a section of the second rail along an extension direction, at least a portion of the reinforcing structure being flush mounted along the longitudinal wall of the second rail to extend the longitudinal wall in thickness;

wherein when the second rail is displaced with respect to the first rail from a first position to a second position, a portion of the reinforcing structure protrudes beyond the first post along the extension direction and outside the rack; and a bracket device mounted on the first rail and an engaging member arranged on the second rail, wherein the bracket device includes a fastening member and an elastic member for applying an elastic force to the fastening member, the fastening member includes a first engaging structure, the engaging member includes a second engaging structure, and the second engaging structure is engaged with the first engaging structure when the second rail is displaced with respect to the first rail to the second position; wherein the first and second engaging structures are respectively disposed on wall surfaces of the first and second rails directly opposing one another.

8. The slide rail assembly of claim 7, wherein the reinforcing structure is a supporting member made of metal and is mounted on the second rail.

9. The slide rail assembly of claim 7, wherein the reinforcing structure is a plurality of supporting ribs provided on the second rail.

* * * * *